United States Patent [19]

Takeshima et al.

[11] Patent Number: 5,334,966
[45] Date of Patent: Aug. 2, 1994

[54] MAGNETOSTATIC FIELD GENERATOR FOR MAGNETIC RESONANCE IMAGING APPARATUS

[75] Inventors: Hirotaka Takeshima, Ryugasaki; Hiroyuki Takeuchi, Kashiwa, both of Japan

[73] Assignee: Hitachi Medical Corp., Tokyo, Japan

[21] Appl. No.: 984,333

[22] Filed: Dec. 2, 1992

[30] Foreign Application Priority Data

Dec. 5, 1991 [JP] Japan .................................. 3-348410

[51] Int. Cl.⁵ .............................................. H01F 7/02
[52] U.S. Cl. .................................................. 335/306
[58] Field of Search ................................ 335/296–306

[56] References Cited

U.S. PATENT DOCUMENTS

| | | | |
|---|---|---|---|
| 4,695,802 | 9/1987 | Zijlstra | 324/319 |
| 4,810,986 | 3/1989 | Leupold | 335/301 |
| 4,953,555 | 9/1990 | Leupold et al. | 335/306 |
| 5,107,239 | 4/1992 | Abele | 335/306 |
| 5,162,770 | 11/1992 | Abele | 335/306 |
| 5,162,771 | 11/1992 | Abele | 335/306 |

FOREIGN PATENT DOCUMENTS 0177903  8/1987  Japan .................................. 335/301

Primary Examiner—Leo P. Picard
Assistant Examiner—Raymond Barrera
Attorney, Agent, or Firm—Antonelli, Terry, Stout & Kraus

[57] ABSTRACT

A magnetostatic field generator for a magnetic resonance imaging apparatus includes a pair of permanent magnets each having a rectangular parallelepiped shape arranged perpendicular to a direction of a uniform magnetic field to surround a space where a uniform magnetic field is generated, a plurality of first permanent magnets each having a trigonal prism shape arranged on both sides of an area between the permanent magnets each having a rectangular parallelepiped shape, a plurality of second permanent magnets each having a trigonal prism shape which are arranged between the permanent magnets each having a rectangular parallelepiped shape and the first permanent magnets and satisfy magnetic field boundary conditions between the permanent magnets each having a rectangular parallelepiped shape and the first permanent magnets, and a yoke for holding the pair of permanent magnets each having a rectangular parallelepiped shape, the plurality of first permanent magnets, and the plurality of second permanent magnets and for forming a magnetic path.

4 Claims, 5 Drawing Sheets

MAGNETOSTATIC FIELD GENERATOR FOR MAGNETIC RESONANCE IMAGING APPARATUS

BACKGROUND OF THE INVENTION

The present invention relates to a magnetostatic field generator for a magnetic resonance imaging apparatus (abbreviated as an MRI apparatus hereinafter), and more particularly to a magnetostatic field generator for an MRI apparatus which is capable of generating an intense and uniform magnetostatic field over a wide range and is economical.

An MRI apparatus displays images of nuclear spin density distribution, relaxation time distribution and the like in an analyte as tomographical images by applying arithmetic processing to a signal measured by utilizing a nuclear magnetic resonance (NMR) phenomenon.

A magnetostatic field having an intensity and a direction which are uniform space-wise and time-wise is required for generating the NMR phenomenon. To be concrete, a magnetostatic field having an intensity of 0.04 to 2 tesla (T) and uniformity of about several ten ppm or less is required in a vacant space having a diameter of approximately 300 to 500 mm. Magnetostatic field generators for generating a magnetostatic field may be classified broadly into three types, i.e., that which uses permanent magnets, or those that use superconductive magnets and normal conductive magnets.

The present invention relates to a magnetostatic field generator using permanent magnets among these three types.

A perspective view of a magnetostatic field generator according to prior art is shown in FIG. 1. The details of the prior art is set forth in JP-A-62-177903. A reference numeral 51 in FIG. 1 represents a tubular core made of a soft magnetic material, and 60a, 60b, 61a, 61b, 62a and 62b represent permanent magnets. The permanent magnets 60a and 60b have a trapezoidal shape, respectively, and are fixedly attached to internal wall surfaces 65a and 65b perpendicular to a direction 100 of the uniform magnetic field of the core 51. Further, the direction of magnetization 70a and 70b is in the same direction as a direction 100 of uniform magnetic field. Furthermore, the permanent magnets 61a, 61b, 62a and 62b have a trigonal prism shape, respectively, and are fixedly attached to internal wall surfaces 66 and 67 parallel to the direction 100 of the uniform magnetic field of the core 51. Further, magnetization 71a, 71b, 72a and 72b of respective permanent magnets 61a, 61b, 62a and 62b point to direction perpendicular to boundary surfaces 81a, 81b, 82a and 82b facing to a vacant space 200.

With such a structure as described above, a uniform magnetic field is generated in the vacant space 200 surrounded by the permanent magnets 60a, 60b, 61a, 61b, 62a and 62b.

Here, a front view of a portion of only one quarter on the right upper side of FIG. 1 is shown in FIG. 2 for further detailed examination. As described above, a uniform magnetic field is generated by means of the permanent magnets 60a and 61a. In the vicinity 90 of a part where both magnets are in contact with each other, however, the permanent magnets are used only for passing a magnetic flux, and do not contribute to generation of the magnetic field in the vacant space 200. Namely, the rate of the intensity of a uniform magnetic field generated in the vacant space 200, i.e., a magnetic field generation efficiency, is lowered with respect to the weight of a permanent magnet material.

Since a permanent magnet material having a large value of a maximum energy product presently obtainable is very expensive, the ratio that the material cost thereof bears to the cost of the magnetic field generator is quite large. Accordingly, it becomes an important subject in development of a magnetic circuit to reduce the weight of the permanent magnets by improving the magnetic field generation efficiency.

SUMMARY OF THE INVENTION

It is an object of the present invention to provide techniques for constructing more economically a magnetostatic field generator capable of solving problems described above and generating an intense and uniform magnetostatic field over a wide vacant space range.

In order to achieve the object described above, there is provided a magnetostatic field generator for a magnetic resonance imaging apparatus composed of a plurality of columnar permanent magnets arranged so as to surround a space for generating a uniform magnetic field and a yoke for holding these permanent magnets and also forming a magnetic path, wherein as shown in FIG. 3, the permanent magnets are composed of a pair of permanent magnets 1a and 1b each having a rectangular parallelepiped shape arranged perpendicularly to a direction of a uniform magnetic field, first permanent magnets 2a, 2b, 3a and 3b each having a trigonal prism shape arranged on both sides of an area surrounded by these pair of permanent magnets each having a rectangular parallelepiped shape, and second small-sized permanent magnets 4a, 4b, 5a and 5b each having a trigonal prism shape arranged, in order to satisfy magnetic field boundary conditions between the permanent magnets each having rectangular parallelepiped shape and first permanent magnets each having a trigonal prism shape, between these permanent magnets.

Further, the angle formed between the direction of magnetization of the first permanent magnet having a trigonal prism shape and the boundary surface on the vacant space side of this permanent magnet is made the maximum within a range where the second small-sized permanent magnet having a trigonal prism shape arranged between the permanent magnet having a rectangular parallelepiped shape and the first permanent magnet having a trigonal prism shape can satisfy the magnetic field boundary conditions between both permanent magnets.

Furthermore, the second small-sized permanent magnet having a trigonal prism shape is made to have a maximum energy product lower than that of the permanent magnet having a rectangular parallelepiped shape and the first permanent magnet having a trigonal prism shape.

In addition, the outside shape of the yoke is formed into a shape almost similar to the inside shape of that yoke.

By constructing the apparatus as described above, a uniform main magnetic field is generated by a pair of permanent magnets each having a rectangular parallelepiped shape arranged perpendicularly to the direction of a uniform magnetic field, a uniform magnetic field is formed in areas on both sides of the main magnetic field by means of the first permanent magnets each having a trigonal prism shape arranged on both sides of the area surrounded by the permanent magnets each having a rectangular parallelepiped shape, and moreover, the magnetic field boundary conditions between the permanent magnet having a rectangular parallelepiped shape and the first permanent magnet having a trigonal prism shape by means of the second small-sized permanent magnet having a trigonal prism shape arranged therebetween. Thus, it is possible to constitute more economically a magnetostatic field generator capable of generating an intense and uniform magnetostatic field over a wide spacial range.

BRIEF DESCRIPTION OF THE DRAWINGS

FIG. 7 is a view showing a method for determining the thickness of a permanent magnet 2a;

FIG. 8 is a diagram showing the relationship between the angle α and the intensity and direction of magnetization of the permanent magnet 4a.

DESCRIPTION OF THE PREFERRED EMBODIMENTS

Figure 1:
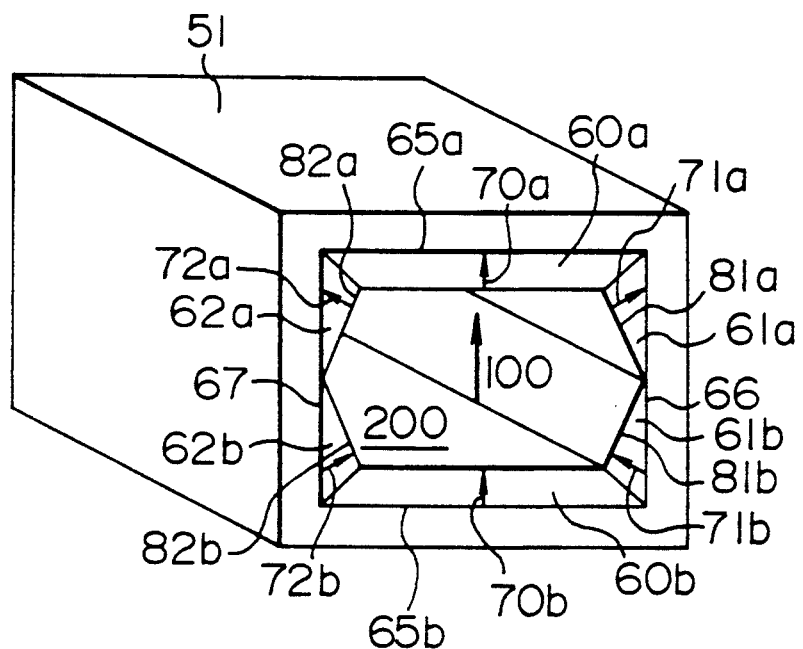
FIG. 1 is a perspective view showing a magnetostatic field generator according to prior art.
Figure 2:
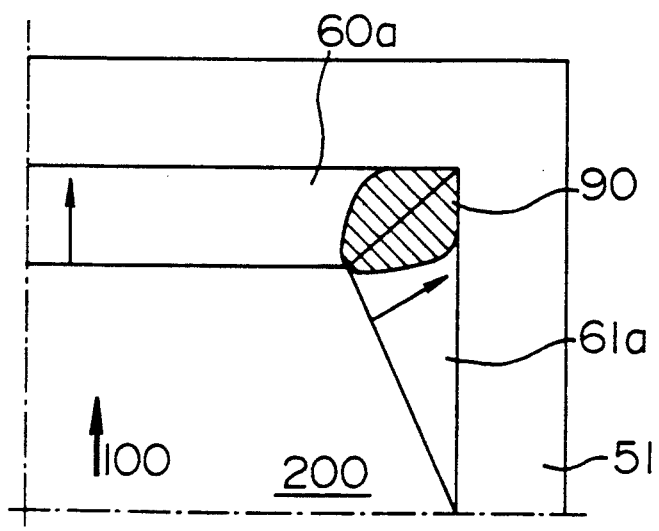
FIG. 2 is a front view for explaining problems of the magnetostatic field generator shown in FIG. 1.
Figure 3:
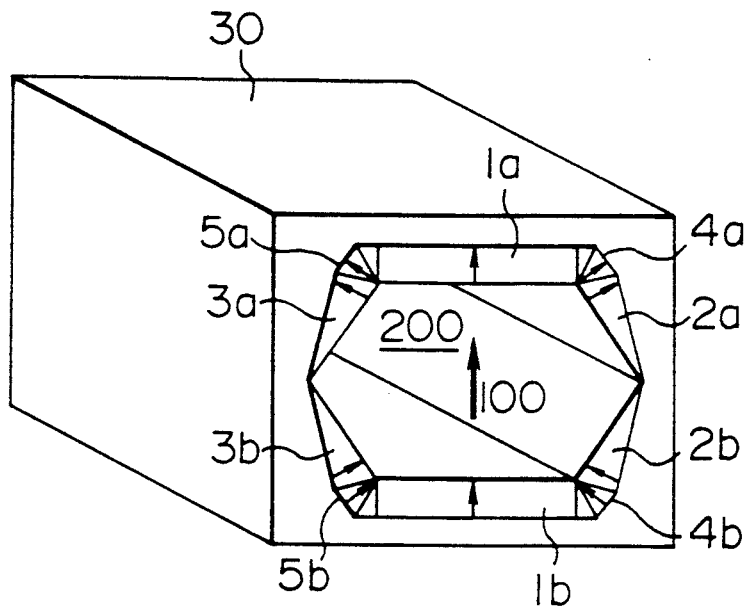
FIG. 3 is a perspective view showing a structure of a magnetostatic field generator for a magnetic resonance imaging apparatus according to an embodiment of the present invention.
Figure 4:
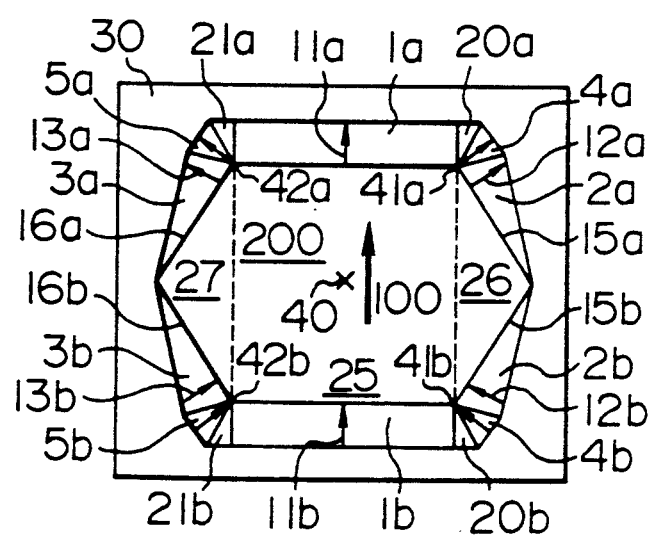
FIG. 4 is a cross-sectional view for showing a structure of magnets of the apparatus shown in FIG. 3.

An embodiment of the present invention will be described in the concrete hereinafter with reference to the drawings. FIG. 3 shows a perspective view of a magnetostatic field generator applied with the present invention, and FIG. 4 shows a cross-sectional view of a central part thereof. An objective uniform magnetic field is generated in a vacant space 200 where an analyte enters.

First, in order to generate a uniform magnetic field at the center of the magnetostatic field generator, permanent magnets 1a and 1b having a pair of surfaces which are parallel and perpendicular to a direction 100 of the uniform magnetic field are arranged. These permanent magnets 1a and 1b are formed in a rectangular parallelepiped shape, and the direction of magnetization 11a and 11b is made to coincide with the direction 100 of the uniform magnetic field as shown in FIG. 4. If these permanent magnets 1a and 1b have infinitely long stretches sideways, it is possible to generate a uniform magnetic field in a space put between these permanent magnets. Since the stretch is limited finitely in actuality, however, an area where the magnetic field is uniform is obtainable only in a very limited narrow area around a center 40 of both magnets. Since magnetic flux generated from the permanent magnets 1a and 1b spread therearound as they depart further from the center 40, the intensity of the magnetic field is reduced and the uniformity of the magnetic field is lowered.

In order to control the diffusion of the magnetic flux so as to suppress reduction of the magnetic field in the peripheral portion, first permanent magnets 2a, 2b, 3a and 3b each having a trigonal prism shape are arranged symmetrically on both sides of a rectangular section 25 surrounded by the permanent magnets 1a and 1b. Angles formed between boundary surfaces 15a, 15b, 16a and 16b on a side of a vacant space 200 of the permanent magnets 2a, 2b, 3a and 3b and the direction 100 of the uniform magnetic field are optionally selectable. Further, apexes 41a, 41b, 42a and 42b of triangular sections of respective permanent magnets 2a, 2b, 3a and 3b on the sides near to the permanent magnets 1a and 1b are arranged so as to coincide with apexes on the sides of the vacant space 200 of the permanent magnets 1a and 1b. With such an arrangement, the magnetic field in the rectangular section 25 surrounded by the permanent magnets 1a and 1b is generated by magnetic flux generated by the upper and lower permanent magnets 1a and 1b.

On the other hand, magnetic fields in sections 26 and 27 each having a triangular shape on both sides of the rectangular section 25 are generated by the magnetic flux generated by outside permanent magnets 2a, 2b and 3a, 3b, respectively. Here, if magnetic fields having the intensity and the direction same as those of a magnetic field generated in the rectangular section 25 can be generated in the sections 26 and 27 each having a triangular shape, substantially the same state as that the areas of the upper and lower permanent magnets are enlarged infinitely is presented. Namely, it is possible to generate a uniform magnetic field in the whole portion in the vacant space 200 surrounded by the permanent magnets 1a, 1b, 2a, 2b, 3a and 3b.

Figure 5:
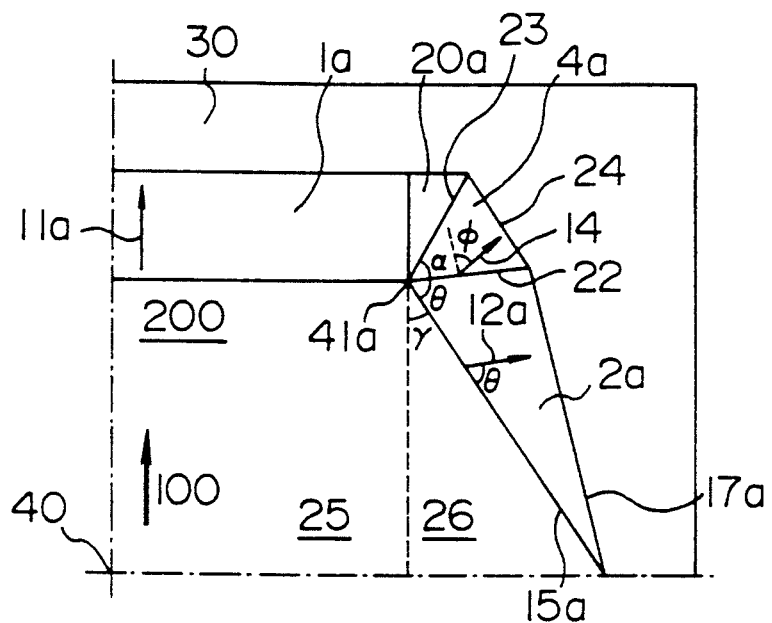
FIG. 5 is a partial front view for showing the details of the magnets shown in FIG. 4.

Next, conditions for generating the uniform magnetic field described above will be discussed. First, when symmetric property of the magnetostatic field generator is taken into consideration, it can be inferred easily that the directions of magnetization 12a, 12b, 13a and 13b of the permanent magnets 2a, 2b, 3a and 3b show symmetric property with respect to the center 40 of the magnets, respectively. Therefore, only one quarter on the right upper side of the apparatus shown in FIG. 4 is shown in FIG. 5 for discussion hereinafter. It is assumed that the angle formed between the direction 100 of the uniform magnetic field and the permanent magnet 2a is an optional angle γ, and the direction of magnetization 12a of the permanent magnet 2a forms an optional angle θ with respect to a boundary surface 15a of the permanent magnet facing the vacant space 200 as shown in FIG. 5. Here, it is required to satisfy the following two terms from Maxwell's equations at the boundary surface 15a of the permanent magnet 2a as the boundary conditions of the magnetic field.

As to a magnetic flux density, components perpendicular to the boundary surface 15a are continuous $$Bn_1 = Bn_2 \tag{1}$$

As to a magnetic field, components parallel to the boundary surface 15a are continuous $$Ht_1 = Ht_2 \tag{2}$$

Further, the magnetic flux density Bm generally has a relationship:

$$Bm = \mu_0 \cdot Hm + Jm \tag{3}$$

between magnetization Jm and magnetic field Hm in a magnetic substance having magnetization Jm. Here, $\mu_0$ represents permeability of vacuum. However, the intensity of magnetization Jm of a permanent magnet is determined in advance depending on the type of the permanent magnet used.

Figure 6:
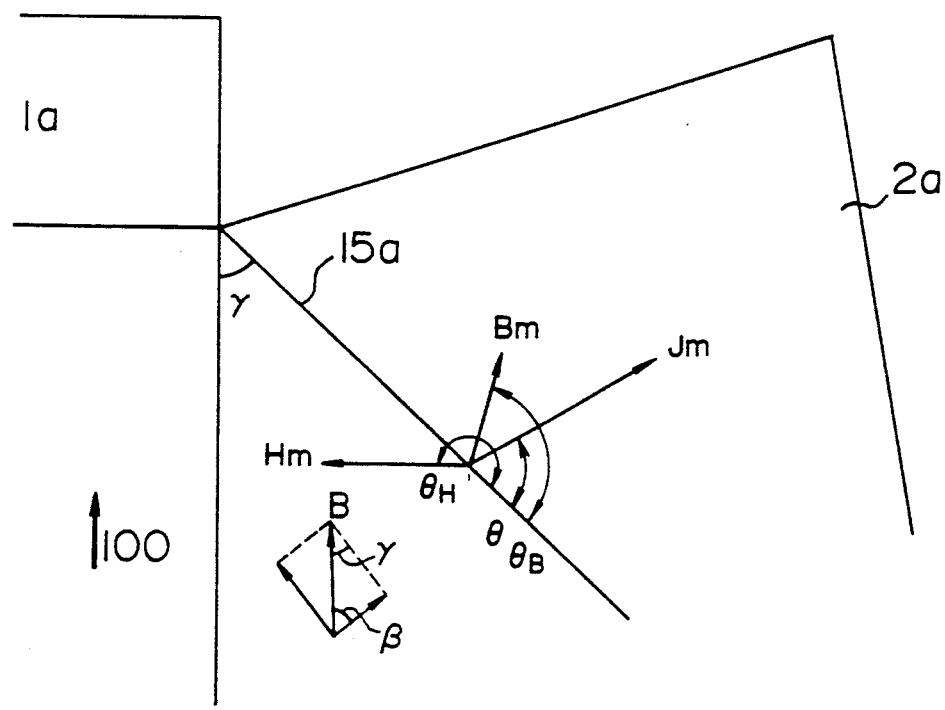
FIG. 6 is a diagram for explaining boundary conditions of the magnets.

Respective vector components in the expression (3) are shown in FIG. 6. When it is assumed that the magnetic flux density in a vacant space 26 is B, and the relationships among the expressions (1), (2) and (3) are shown by vector components, the following equations are obtained.

$$\cos \beta = Bm \cdot \sin \theta_B \quad (4)$$

$$\frac{B}{\mu_0} \cdot \sin \beta = Hm \cdot \cos \theta_H \quad (5)$$

$$Bm \cdot \cos \theta_B = \mu_0 Hm \cos \theta_H + Jm \cos \theta \quad (6)$$

$$Bm \cdot \sin \theta_B = \mu_0 Hm \sin \theta_H + Jm \sin \theta \quad (7)$$

The magnetic flux density B and the magnetic field H in the vacant space 26 are set to values which can be designed. Thus, the magnetic flux density B in the expressions (4) and (5) can be set so as to show the same value as that of the uniform magnetic field 100. Accordingly, when the angle $\theta$ formed between the direction of magnetization 12a and the boundary surface 15a is determined once, it is possible to obtain the magnetic field Hm and the magnetic flux density Bm in the permanent magnet 2a in which the magnetic field in the vacant space 26 becomes the same as the uniform magnetic field 100 from the expressions (4) to (7).

On the other hand, when there is no leakage magnetic flux from a magnetic circuit, the following expression has to be effected in general among a magnetic field Hm in the magnet, a magnetic field Hg in the vacant space, the length lm of the magnet and the length lg of the space along the flow of certain continuous magnetic flux.

$$Hm \cdot lm = -Hg \cdot lg \quad (8)$$

Figure 7:
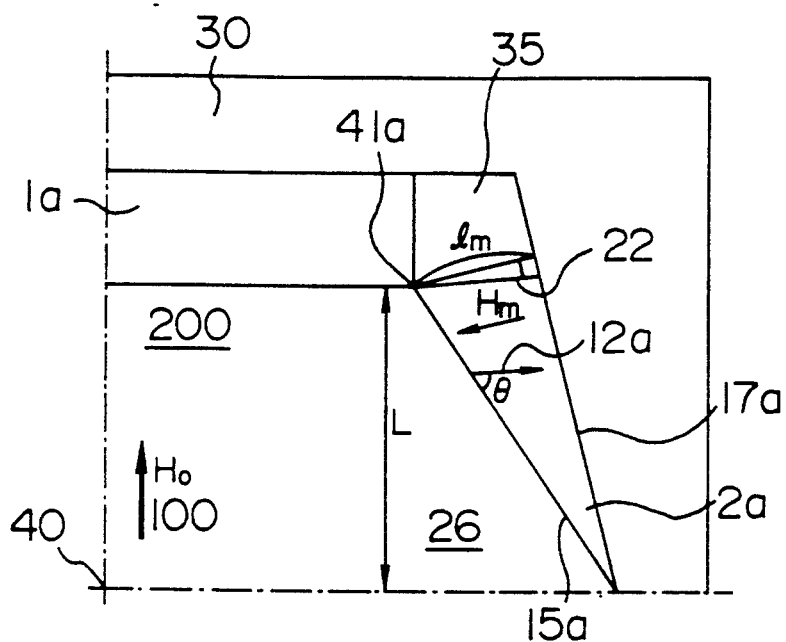

The thickness toward yoke direction of the permanent magnet 2a required for the expression (8) to be effected at a position of a vertex 41a at the left upper part of the permanent magnet 2a is considered. Only the permanent magnet 2a is picked out to be shown in FIG. 7 for the sake of explanation.

As shown in FIG. 3, a yoke 30 having sufficiently large permeability is arranged very closely around the permanent magnets described in the present invention. A soft magnetic material such as a silicon steel material and an iron material is used for this yoke. This yoke is used for holding the permanent magnets mechanically and also as a path for the magnetic flux generated from the permanent magnets. Therefore, the thickness of the yoke is required to be sufficiently thick to the extent that the magnetic flux density of the yoke is not saturated by the magnetic flux passing therethrough.

Further, the boundary surface between the permanent magnet 2a and the yoke 30 must be almost perpendicular to the magnetic field Hm in the permanent magnet. If this condition is not satisfied, but the magnetic field Hm contains components parallel to the boundary surface, magnetic field component of the same size is also in existence in the yoke 30 from the boundary condition (2) of the magnetic field described above. Since the magnetic flux density of the yoke 30 is saturated when this magnetic field component becomes larger than a certain degree, it becomes impossible to pass the magnetic flux sufficiently through the yoke. As a result, the flow of the magnetic flux is disturbed, thereby to deteriorate the uniformity of the magnetic field in the vacant space 200.

Now, the right side of the expression (8) is given by a product $H_0 \cdot L$ of the design intensity $H_0$ of the uniform magnetic field 100 and the distance n of a perpendicular line drawn from the apex 41a. On the other hand, since the magnetic field Hm in the permanent magnet 2a has been obtained previously, the thickness lm in the yoke direction of the permanent magnet 2a required at the position of the apex 41a can be determined by the expression (8). In such a manner as described above, it is possible to determine the shape of the permanent magnet 2a, and to generate a uniform magnetic field in the triangular section 26.

However, the boundary conditions (1) and (2) described above are not satisfied in a space 35 put between the permanent magnets 1a and 2a only by two permanent magnets 1a and 2a described above. Hence, the flow of the magnetic flux is disturbed. Such disturbance exerts an influence also upon the uniformity of the magnetic field in a vacant space 200. So, still another small permanent magnet 4a in a trigonal prism shape is arranged in a space 35 between the permanent magnets 1a and 2a in order to satisfy the boundary conditions of the magnetic field in the space 35, too.

As shown in FIG. 5, a boundary surface 22 of the permanent magnet 2a in a trigonal prism shape the thickness of which has been determined previously is placed in parallel with the direction of the magnetization 12a in order to unify the magnetic field in the vacant space 35. Further, one of three boundary surfaces of the permanent magnet 4a is made common with the boundary surface 22. Another boundary surface 23 having the boundary surface 22 and the apex 41a in common is arranged so as to form an angle $\alpha$ with the boundary surface 22. In addition, this boundary surface 23 is divided at a position where it intersects with an extension line of an outside side of the permanent magnet 1a. Another remaining boundary surface 24 is obtained by connecting the lines of the two boundary surfaces 22 and 23 described above. It is sufficient that the intensity and the direction of magnetization 14 of this permanent magnet 4a are determined so that the two boundary conditions (1) and (2) are satisfied on the boundary surface 22 between the permanent magnet 2a and the permanent magnet 4a and the boundary surface 23 between a small vacant space 20a and the permanent magnet 4a, and the expression (3) is satisfied in the permanent magnet 4a. The intensity and the direction of magnetization 14 in the permanent magnet 4a which satisfy the conditions described above can be determined by deciding the angle $\alpha$ at the apex 41a of the permanent magnet 4a.

Figure 8:
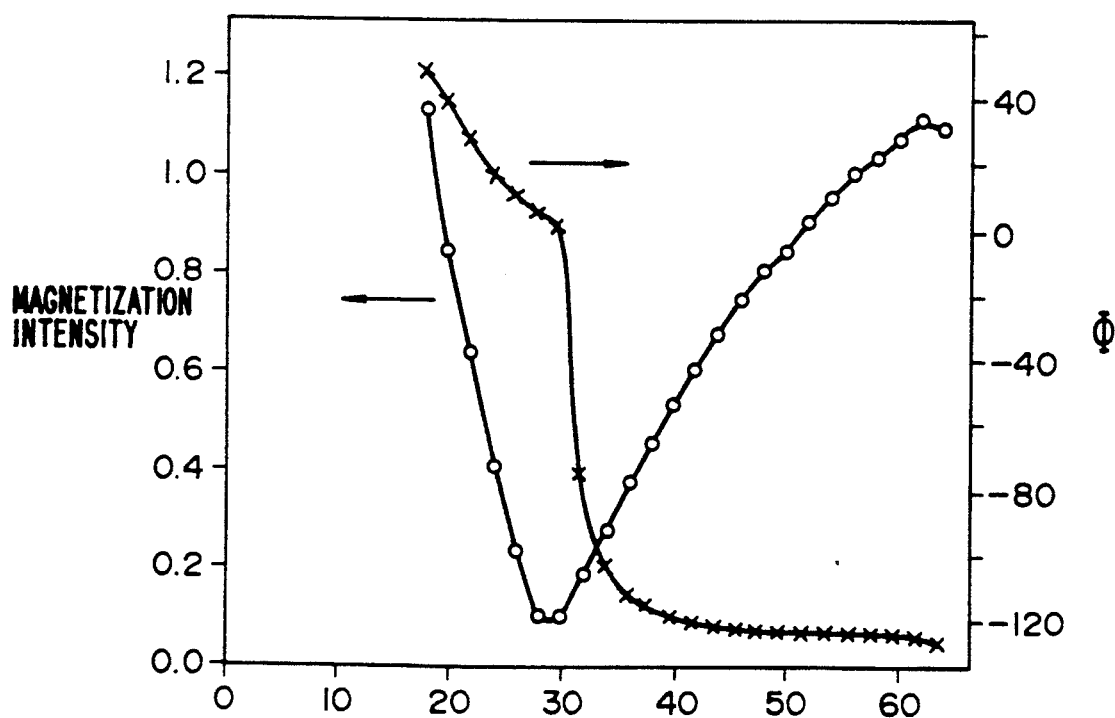

FIG. 8 shows an example in which the state that the direction $\Phi$ and the intensity of magnetization 14 which satisfy the boundary conditions (1) to (3) are changed is computed. In FIG. 8, the axis of abscissa represents an angle $\alpha$, and the axis of ordinate on the left side represents the intensity of magnetization and the axis of ordinate on the right side represents the direction $\Phi$ of magnetization which is an angle formed by magnetization 14 with respect to a normal line drawn to the boundary surface 22. A mark "○" shows the intensity of magnetization and a mark "x" shows the direction of magnetization. This figure shows a case that the intensity of the uniform magnetic field 100 is set at 0.3 tesla, permanent magnets 1a and 2a having a residual magnetic flux density of 1.2 tesla are used, an angle formed between the boundary surface 15a of the permanent magnet 2a and the uniform magnetic field is 45°, and the direction θ of magnetization of the permanent magnet 2a is set to 70°. It is understood that both the intensity and the direction of magnetization 14 vary by a large margin depending on the angle α. Such a fact shows that it is possible to select the permanent magnet 4a having a predetermined magnetic characteristic by the angle α.

The matter described above is materialized when it is assumed that the characteristic of the permanent magnet is ideal, a permanent magnet having a uniform inside quality is used, and the permeability of the yoke is infinitely high. Since these conditions are not satisfied perfectly in a practical magnetostatic field generator, the uniformity of the magnetic field deviates from an ideal state. Practically, however, the deviation is not so large, thus making it possible to recover the uniformity of the magnetic field by tilting the direction of magnetization from the computed value obtained as described above little by little. For the examination thereof, a magnetic field simulation by a computer which has advanced rapidly of late can be utilized.

An apparatus according to the present invention is composed of a pair of permanent magnets 1a and 1b each having a rectangular section for generating a main magnetic field, a plurality of permanent magnets 2a, 2b, 3a and 3b each having a trigonal prism shape for suppressing leakage of magnetic flux out of the area surrounded by those permanent magnets and permanent magnets 4a, 4b, 5a and 5b each having a trigonal prism shape for satisfying boundary conditions among the magnets as described above. Further, the directions of magnetization of the permanent magnets 2a, 2b, 3a and 3b can be selected optionally as described above, and it is sufficient that the thickness of the permanent magnet is changed in accordance with the direction of magnetization thereof. Further, since the intensity and the direction of magnetization of the permanent magnets 4a, 4b, 5a and 5b are determined by the angle α, it is sufficient to select the angle α appropriately in accordance with the characteristic of a permanent magnet used.

Now, in a magnetostatic field generator of a permanent magnet type, the rate of the cost of the permanent magnet material to the cost of the apparatus is very large. Hence, it is a very important subject to reduce the quantity of the permanent magnet material used. A shape which makes the quantity of the permanent magnet material used the smallest in the magnetostatic field generator is discussed herein.

First, when the intensity of a required uniform magnetic field is determined, the thickness of the permanent magnets 1a and 1b for generating a main magnetic field is determined from the expression (8). Further, since the width and the length are determined from the dimensions of the required rectangular section 25, there is no way to reduce the weight of these permanent magnets 1a and 1b.

Next, when the permanent magnet 2a in a trigonal prism shape is viewed, the dimensions are also determined by the expression (8) mentioned previously. Namely, as the magnetic field intensity Hm in the permanent magnet 2a gets higher, the shorter length lm will suffice, thus making it possible to reduce the weight thereof. On the other hand, the magnetic field intensity increases with the increase of the angle θ formed between magnetization 12a and the boundary surface 15a. When the angle θ reaches a certain value or more, however, it becomes impossible to satisfy the boundary conditions at the permanent magnet 4a. Therefore, the uniformity of the magnetic field is deteriorated. It may be said from the foregoing that the weight of the permanent magnet 2a becomes the minimum when θ shows the maximum value within a range where the boundary conditions at the permanent magnet 4a are satisfied.

Computation has been made practically with respect to a case that the intensity 100 of the uniform magnetic field is set to 0.5 tesla, permanent magnets 1a and 2a having a residual magnetic flux density of 1.2 tesla are used, and an angle formed between the boundary surface 15a of the permanent magnet 2a and the uniform magnetic field is set to 45°. The direction of magnetization θ of the permanent magnet 2a which makes the quantity of permanent magnets used the minimum was 75.7° and the angle α was 48.9°. When the total sectional area of the permanent magnets 2a and 4a in this case is compared with a case in which sectional area of magnets of the apparatus disclosed in JP-A-62-177903 mentioned previously, it is noticed that the quantity of permanent magnets used can be reduced by approximately 9%.

Now, since signal intensity gets higher as the magnetic field intensity gets higher in an MRI apparatus, it is desirable that the magnetic field intensity is high. In order to obtain high magnetic field intensity at about 0.3 tesla or higher among permanent magnet materials presently available, there is no other way but to use a neodymium magnet having maximum energy product. Since this permanent magnet material is expensive, however, the cost of the apparatus also becomes quite expensive. However, as it is seen from FIG. 8, those permanent magnets having small maximum energy product may be used for small-sized permanent magnets 4a, 4b, 5a and 5b for satisfying the boundary conditions by selecting the angle α appropriately. Thus, it is possible to control the total permanent magnet material expense low by using those materials that have low maximum energy product but are inexpensive as compared with a neodymium magnet such as a praseodymium magnet and a ferrite magnet.

Figure 9:
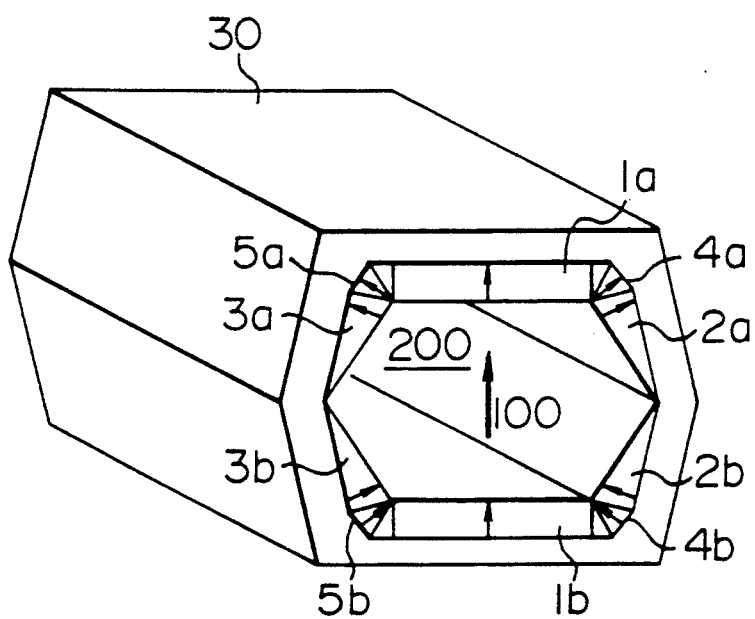
FIG. 9 is a perspective view for showing a magnetostatic field generator according to another embodiment of the present invention.

Another embodiment of the present invention is shown in FIG. 9. In FIG. 9, shapes and arrangement of permanent magnets 1 to 5 are the same as those in the embodiment described above. What differs from that embodiment is that the lateral outside surface of the yoke 30 is formed in a shape almost in parallel with the inside surface thereof and the whole outside shape is formed into an almost similar figure to the inside surface. It is sufficient that the yoke 30 has such a thickness that the leakage magnetic flux toward the outside of the apparatus falls within a design value. Therefore, in the case of FIG. 3, the yoke is made thicker than required at four corners of the yoke 30. It is possible to reduce the weight of the whole magnetic circuit and also to make the outer dimensions small by forming the shape of the yoke 30 as shown in FIG. 9 and determining the thickness appropriately.

By constructing the apparatus according to the present invention, a uniform main magnetic field is generated by a pair of permanent magnets 1a and 1b each having a rectangular parallelepiped shape arranged perpendicularly to the direction of the uniform magnetic field, a uniform magnetic field is generated in the areas on both sides of the main magnetic field by the first permanent magnets 2a, 2b, 3a and 3b each having a trigonal prism shape arranged on both sides of the area surrounded by the permanent magnets each having a rectangular parallelepiped shape, and furthermore, it is possible to satisfy the boundary conditions of the magnetic field among the permanent magnets each having a rectangular parallelepiped shape and the permanent magnets each having a trigonal prism shape by the second small-sized permanent magnets 4a, 4b, 5a and 5b each having a trigonal prism shape arranged among the permanent magnets. Thus, it is possible to construct a magnetostatic field generator capable of generating an intense and uniform magnetostatic field over a wide space range more economically.

Further, it is possible to make the quantity of permanent magnets used the smallest, thus forming more economical magnetostatic field generator, by making the angle formed between the direction of magnetization of the first permanent magnets each having a trigonal prism shape and the boundary surface on the vacant space side of the permanent magnets the maximum within a range that the second small-sized permanent magnets 4a, 4b, 5a and 5b each having a trigonal prism shape arranged between the permanent magnets 1a and 1b each having a rectangular parallelepiped shape and the first permanent magnets 2a, 2b, 3a and 3b each having a trigonal prism shape can satisfy the magnetic field boundary conditions between both permanent magnets.

We claim:

1. A magnetostatic field generator for a magnetic resonance imaging apparatus comprising:

a pair of permanent magnets each having a rectangular parallelepiped shape arranged perpendicular to a direction of a uniform magnetic field so as to surround a first space where said uniform magnetic field is generated;

a plurality of first permanent magnets each having a trigonal prism shape arranged on both sides of an area between said permanent magnets each having a rectangular parallelepiped shape;

a plurality of second permanent magnets each having a trigonal prism shape which are arranged between said permanent magnets each having a rectangular parallelepiped shape and said first permanent magnets and satisfy magnetic field boundary conditions including a magnetization direction of said second permanent magnets being determined so that (1) first perpendicular components of magnetic flux density in respective ones of said first permanent magnets and said second permanent magnets, which are perpendicular to a first boundary surface at which respective ones of said first permanent magnets and said second permanent magnets contact each other, are continuous at said first boundary surface, (2) first parallel components of a magnetic field in respective ones of said permanent magnets and said second permanent magnets which are parallel to said first boundary surface, are continuous at said first boundary surface, (3) second perpendicular components of magnetic flux density in a second space between respective ones of said permanent magnets having a rectangular parallelepiped shape and said second permanent magnets which are perpendicular to a second boundary surface at which respective ones of said second permanent magnets face said second space, are continuous at said second boundary surface, and (4) second parallel components of a magnetic field in said second space and respective ones of said second permanent magnets which are parallel to said second boundary surface, are continuous at said second boundary surface; and a yoke for holding said permanent magnets each having a rectangular parallelepiped shape, said plurality of first permanent magnets, and said plurality of second permanent magnets and forming a magnetic path, said yoke contacting said pair of permanent magnets each having a rectangular parallelepiped shape, said plurality of first permanent magnets, and said plurality of second permanent magnets.

2. A magnetostatic field generator for a magnetic resonance imaging apparatus according to claim 1, wherein a direction of magnetization of respective ones of said first permanent magnets show a maximum value of an angle formed with a boundary surface at which respective ones of said first permanent magnets face said first space.

3. A magnetostatic field generator for a magnetic resonance imaging apparatus according to claim 1, wherein said yoke comprises outer surfaces parallel to inner surfaces which contact said first permanent magnets.

4. A magnetostatic field generator for a magnetic resonance imaging apparatus comprising:

a pair of permanent magnets each having a rectangular parallelepiped shape arranged perpendicular to a direction of a uniform magnetic field so as to surround a space where said uniform magnetic field is generated;

a plurality of first permanent magnets each having a trigonal prism shape arranged on both sides of an area between said permanent magnets each having a rectangular parallelepiped shape;

a plurality of second permanent magnets each having a trigonal prism shape which are arranged between said permanent magnets each having a rectangular parallelepiped shape and said first permanent magnets and satisfy magnetic field boundary conditions between said permanent magnets each having a rectangular parallelepiped shape and said first permanent magnets; and a yoke for holding said permanent magnets each having a rectangular parallelepiped shape, said plurality of first permanent magnets, and said plurality of second permanent magnets and forming a magnetic path;

wherein said second permanent magnets have a maximum energy product lower than that of said permanent magnets each having a rectangular parallelepiped shape and said first permanent magnets.

* * * * *